(12) United States Patent
Montoya et al.

(10) Patent No.: US 11,876,056 B2
(45) Date of Patent: Jan. 16, 2024

(54) SILICON NITRIDE METAL LAYER COVERS

(71) Applicant: TEXAS INSTRUMENTS INCORPORATED, Dallas, TX (US)

(72) Inventors: Jonathan Andrew Montoya, Dallas, TX (US); Salvatore Franks Pavone, Murphy, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 23 days.

(21) Appl. No.: 17/246,561

(22) Filed: Apr. 30, 2021

(65) Prior Publication Data
US 2022/0352098 A1 Nov. 3, 2022

(51) Int. Cl.
*H01L 23/00* (2006.01)

(52) U.S. Cl.
CPC ............ *H01L 23/564* (2013.01); *H01L 24/03* (2013.01); *H01L 24/05* (2013.01); *H01L 24/13* (2013.01); *H01L 2224/0346* (2013.01); *H01L 2224/0391* (2013.01); *H01L 2224/0401* (2013.01); *H01L 2224/05024* (2013.01); *H01L 2224/13026* (2013.01); *H01L 2924/05042* (2013.01); *H01L 2924/07025* (2013.01)

(58) Field of Classification Search
CPC ..... H01L 2224/0391; H01L 2224/0401; H01L 2924/07025; H01L 2924/05042
See application file for complete search history.

(56) References Cited

U.S. PATENT DOCUMENTS

| | | | |
|---|---|---|---|
| 2010/0244241 A1* | 9/2010 | Marimuthu | H01L 21/56 257/737 |
| 2012/0032338 A1* | 2/2012 | Komori | H01L 21/76801 257/773 |
| 2012/0217633 A1* | 8/2012 | Liu | H01L 23/3192 257/737 |
| 2014/0054764 A1* | 2/2014 | Lu | H01L 24/05 257/737 |

* cited by examiner

*Primary Examiner* — Dale E Page
*Assistant Examiner* — Wilner Jean Baptiste
(74) *Attorney, Agent, or Firm* — Dawn Jos; Frank D. Cimino

(57) ABSTRACT

In some examples, a semiconductor package includes a semiconductor die; a passivation layer abutting a device side of the semiconductor die; a first conductive layer abutting the device side of the semiconductor die; a second conductive layer abutting the first conductive layer and the passivation layer; a silicon nitride layer abutting the second conductive layer, the silicon nitride layer having a thickness ranging from 300 Angstroms to 3000 Angstroms; and a third conductive layer coupled to the second conductive layer at a gap in the silicon nitride layer, the third conductive layer configured to receive a solder ball.

15 Claims, 6 Drawing Sheets

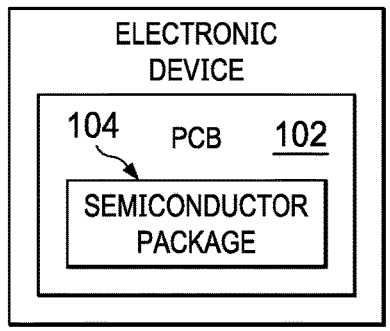

FIG. 1

APPLY BACKSIDE COAT TO NON-DEVICE SIDE OF SEMICONDUCTOR DIE AND APPLY CONDUCTIVE LAYERS AND PASSIVATION LAYER TO DEVICE SIDE OF SEMICONDUCTOR DIE USING PHOTOLITHOGRAPHY TECHNIQUES — 302

APPLY SILICON NITRIDE LAYER TO A CONDUCTIVE LAYER — 304

ETCH A GAP INTO SILICON NITRIDE TO EXPOSE UNDERLYING CONDUCTIVE LAYER — 306

APPLY POLYIMIDE LAYER AND ETCH — 308

FORM THIRD CONDUCTIVE LAYER AT GAP AND DROP SOLDER BALL — 310

FIG. 3

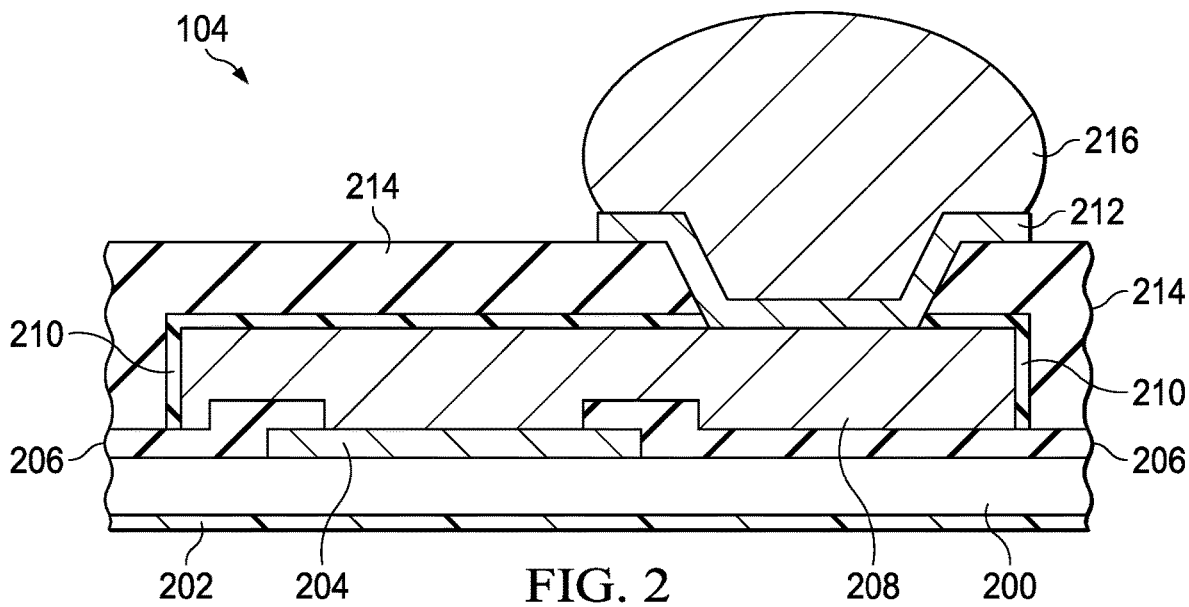

SILICON NITRIDE METAL LAYER COVERS

BACKGROUND

Semiconductor chips are housed inside packages that protect the chips from deleterious environmental influences, such as heat, moisture, and debris. A packaged chip generally communicates with electronic devices outside the package via conductive members (e.g., leads) that are exposed to surfaces of the package. In some types of packages, these conductive members (or layers) take the form of redistribution layers (RDLs) and under bump metallurgy (UBM) that provide conductive pathways between the chip and solder balls that are positioned on an exterior of the package and that couple to a printed circuit board (PCB).

SUMMARY

In some examples, a semiconductor package includes a semiconductor die; a passivation layer abutting a device side of the semiconductor die; a first conductive layer abutting the device side of the semiconductor die; a second conductive layer abutting the first conductive layer and the passivation layer; a silicon nitride layer abutting the second conductive layer, the silicon nitride layer having a thickness ranging from 300 Angstroms to 3000 Angstroms; and a third conductive layer coupled to the second conductive layer at a gap in the silicon nitride layer, the third conductive layer configured to receive a solder ball.

In some examples, a method comprises plating a first conductive layer on a second conductive layer, the second conductive layer coupled to a device side of a semiconductor die. The method comprises using a vapor deposition technique to deposit a silicon nitride layer on the first conductive layer at a pressure lower than 100 Torr. The method includes plating a second conductive layer abutting the first conductive layer, the second conductive layer configured to receive a solder ball.

BRIEF DESCRIPTION OF THE DRAWINGS

For a detailed description of various examples, reference will now be made to the accompanying drawings in which:

FIG. 1 is a diagram of an electronic device containing a semiconductor package having a silicon nitride layer protecting a metal layer, in accordance with various examples.

FIG. 2 is a profile cross-sectional view of a semiconductor package having a silicon nitride layer protecting a metal layer, in accordance with various examples.

FIG. 3 is a flow diagram of a method for manufacturing a semiconductor package having a silicon nitride layer protecting a metal layer, in accordance with various examples.

DETAILED DESCRIPTION

Figure 4A:
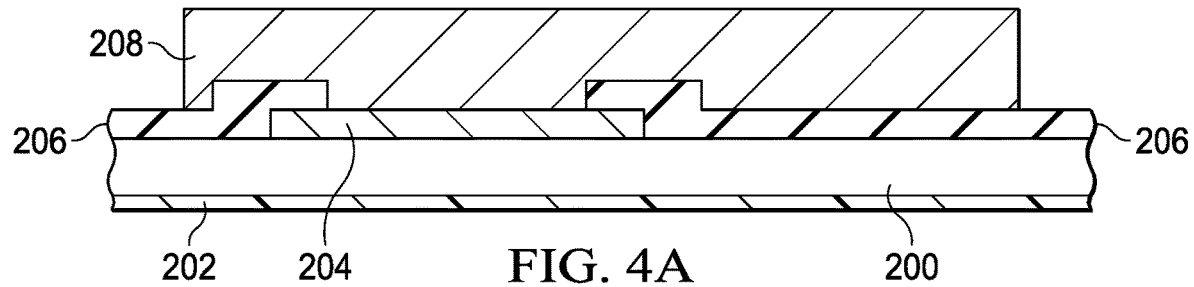
FIGS. 4A-4F are a process flow for manufacturing a semiconductor package having a silicon nitride layer protecting a metal layer, in accordance with various examples.

As described above, many semiconductor packages include conductive layers, such as RDLs and UBMs, that facilitate communications between a semiconductor chip (or die) and other electronic components on a PCB. These conductive layers are formed of metals that are vulnerable to corrosion, such as copper. Corroded metals may negatively impact the structural and functional integrity of a package. Further, the metals may be susceptible to migration, which also negatively affects package performance.

This disclosure describes various examples of a semiconductor package that resolves the challenges described above. In examples, the semiconductor package includes a thin silicon nitride layer that covers metals, such as copper, that are susceptible to corrosion and migration. For instance, a silicon nitride layer may cover one or more metal layers in an RDL. The silicon nitride layer may have features that enhance its performance and durability, such as a high density that blocks moisture and corrosion and effectively mitigates migration, low thickness (e.g., between 300 Angstroms and 3000 Angstroms) that mitigates package bulk, and a film stress ranging from −2 GPa to 2 GPa to facilitate package sawing. These features may be achieved at least in part by depositing the silicon nitride layer using a vapor deposition technique, such as physical vapor deposition (PVD) or plasma-enhanced chemical vapor deposition (PECVD), at low pressure (e.g., less than 100 Torr) and a temperature in the range of 325 degrees Celsius to 425 degrees Celsius.

FIG. 1 is a diagram of an electronic device 100 containing a semiconductor package having a silicon nitride layer protecting a metal layer, in accordance with various examples. In particular, the electronic device 100 may include a personal electronic device (e.g., smartphones, laptop computers, desktop computers, tablets, notebooks, artificial intelligence assistants), an electronic appliance (e.g., refrigerators, microwave ovens, toaster ovens, dishwashers), a networking or enterprise-level electronic device or system (e.g., servers, routers, modems, mainframe computers, wireless access points), an automobile or aviation device or system (e.g., control panels, entertainment devices, navigation devices, power electronics), or any of a variety of other electronic devices or systems. The electronic device 100 may include a printed circuit board (PCB) 102 and a semiconductor package 104 coupled to the PCB 102. Notwithstanding the particular manner in which the drawings depict the semiconductor package 104, the semiconductor package 104 may be any suitable type of package, such as a dual inline package (DIP), a quad flat no-lead (QFN) package, a package having gullwing style leads, a flip-chip style package, a ball grid array (BGA) package, a combination of one or more such package types, etc. In the drawings, the semiconductor package 104 is depicted as a chip scale package, such as a wafer-level chip scale package (WCSP). As explained, however, any type of package in which the above-described challenges are present, such as migration and metal corrosion due to exposure, may benefit from the structures and techniques described herein.

FIG. 2 is a profile cross-sectional view of a portion of the semiconductor package 104 having a silicon nitride layer protecting a metal layer, in accordance with various examples. The semiconductor package 104 may be larger than the portion shown in FIG. 2, but the portion shown in FIG. 2 is representative. The portions shown in other drawings and described below are similarly representative of entire semiconductor packages 104. In examples, the semiconductor package 104 includes a semiconductor die 200. A protective backside coat 202 abuts a non-device side of the semiconductor die 200. A conductive layer 204 (e.g., composed of copper or another suitable metal or metal alloy) abuts a portion of a device side of the semiconductor die 200. A device side of the semiconductor die 200 is one in which circuitry is formed. A passivation overcoat (PO) layer 206 abuts portions of the device side of the semiconductor die 200 and the conductive layer 204. A conductive layer 208 (e.g., composed of copper of another suitable metal or metal alloy) abuts portions of the conductive layer 204 and the PO layer 206. A silicon nitride (SiN) layer 210 abuts the conductive layer 208. A gap exists in the SiN layer 210, and a conductive layer 212 (e.g., an under bump metallization or metallurgy (UBM), composed of copper or another suitable metal or metal alloy) abuts the conductive layer 208 at this gap in the SiN layer 210. A polyimide layer 214 abuts the SiN layer 210 and portions (e.g., an underside) of the conductive layer 212 and the PO layer 206. A solder ball 216 is positioned in the conductive layer 212.

The SiN layer 210 has a high density that enhances both the moisture resistance and the durability of the SiN layer 210. If too low, the density of the SiN layer 210 results in unacceptably low moisture resistance, electromigration, corrosion of the conductive layer 208, and unacceptably premature structural and functional degradation of the SiN layer 210. The thickness of the SiN layer 210 may be uniform or may vary. In either case, the thickness of the SiN layer 210 ranges from 300 Angstroms to 3000 Angstroms. A SiN layer 210 thinner than this range is disadvantageous because it may result in inadequate coverage by the SiN layer 210 in some areas and possible damage (e.g., oxidation) to the underlying metal, and a SiN layer 210 thicker than this range is disadvantageous because it causes wafer structural degradation and bowing. The SiN layer 210 has a film stress ranging from −2 to 2 GPa as measured on a bare silicon wafer using Stoney's equation and wafer bow measurements, with a film stress outside this range resulting in SiN layer 210 delamination and difficulties with subsequent package singulation (also called wafer sawing). This density range and film stress range are achieved at least in part by depositing the SiN layer 210 using a vapor deposition technique, such as physical vapor deposition (PVD) or plasma-enhanced chemical vapor deposition (PECVD), at low pressures (e.g., less than 100 Torr) and a temperature in the range of 325 C to 425 C. Parameters outside of these ranges produce a SiN layer 210 density and film stress that is outside of the ranges described above, with their attendant disadvantages.

Figure 4B:
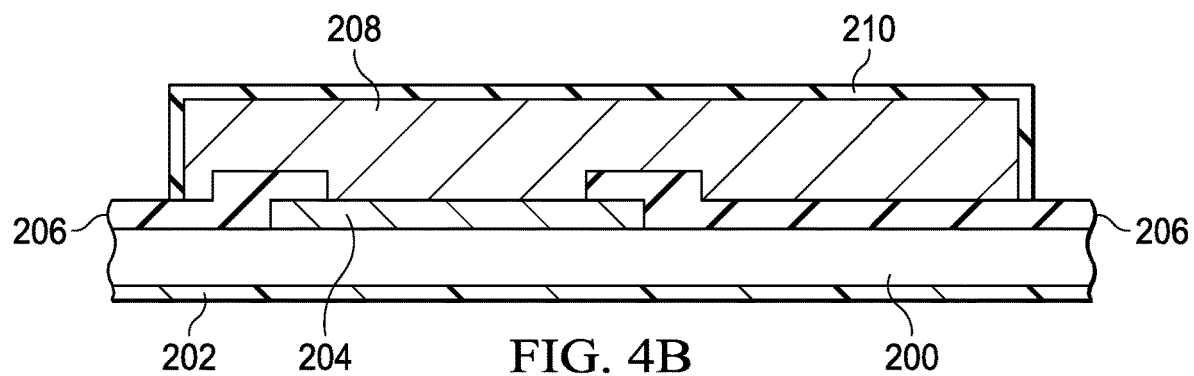
Figure 4C:
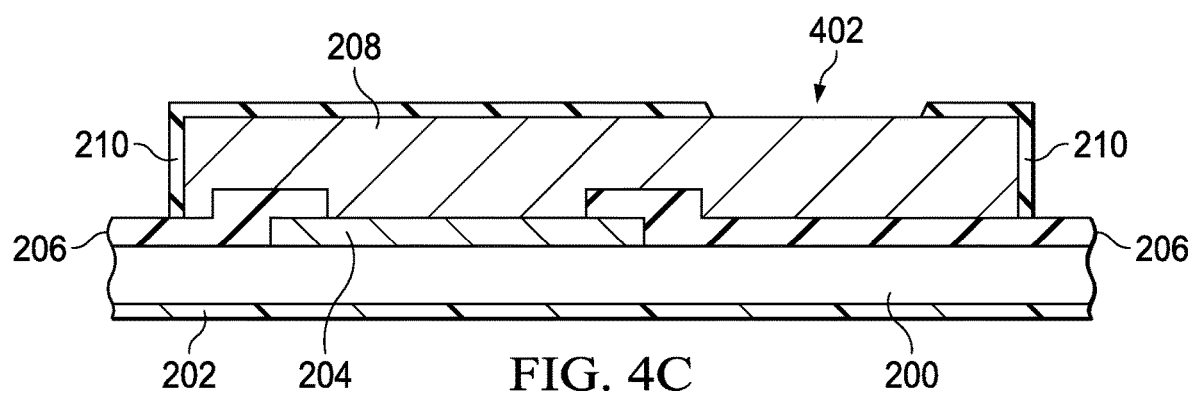

FIG. 3 is a flow diagram of a method 300 for manufacturing the semiconductor package 104, in accordance with various examples. FIGS. 4A-4F are a process flow for manufacturing the semiconductor package 104, in accordance with various examples. Accordingly, FIGS. 3 and 4A-4F are now described in parallel. The method 300, like the method 600 described below, may be performed at the wafer stage, prior to die singulation. The method 300 begins with applying a backside coat to a non-device side of a semiconductor die and applying conductive layers (e.g., by plating) and a passivation layer to a device side of the semiconductor die using photolithography techniques (302). FIG. 4A is a profile cross-sectional view of the semiconductor die 200, the backside coat 202 abutting the non-device side of the semiconductor die 200, the conductive layer 204 abutting the device side of the semiconductor die 200, the PO layer 206 abutting the conductive layer 204 and the device side of the semiconductor die 200, and the conductive layer 208 abutting the conductive layer 204 and the PO layer 206. The method 300 includes applying a SiN layer to a conductive layer (304). FIG. 4B shows the SiN layer 210 having been deposited on the conductive layer 208. The SiN layer 210 has the qualities and is deposited using the specific techniques described above. The method 300 includes etching a gap in the SiN layer to expose the underlying conductive layer (306). FIG. 4C shows a gap 402 having been etched in the SiN layer 210 to expose the underlying conductive layer 208. The SiN layer 210 may be etched using a dry etch or a wet etch. For example, a hydrofluoric acid etchant may be used. In the example of FIG. 4C, the use of a photoresist etch mask is assumed, but other materials (e.g., polyimide) also may be used. The gap 402 may be of any suitable width, but in examples, is at least as wide as necessary to facilitate the conduction of sufficient current for the intended application.

Figure 4D:
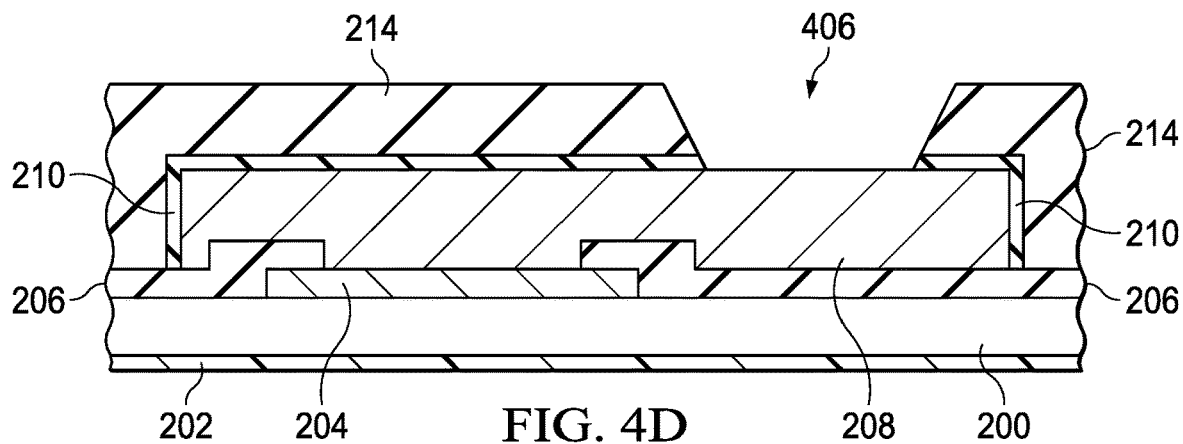
Figure 4E:
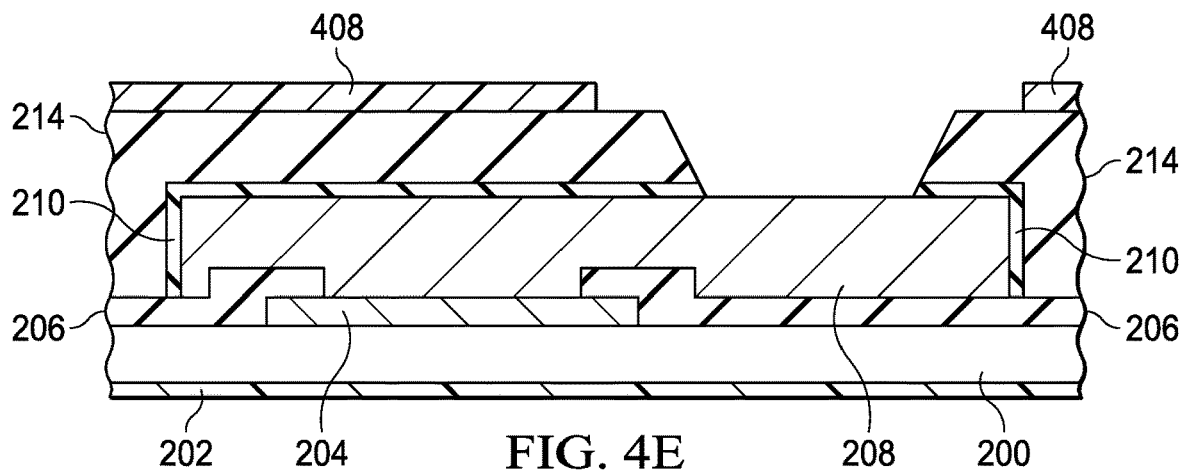
Figure 4F:
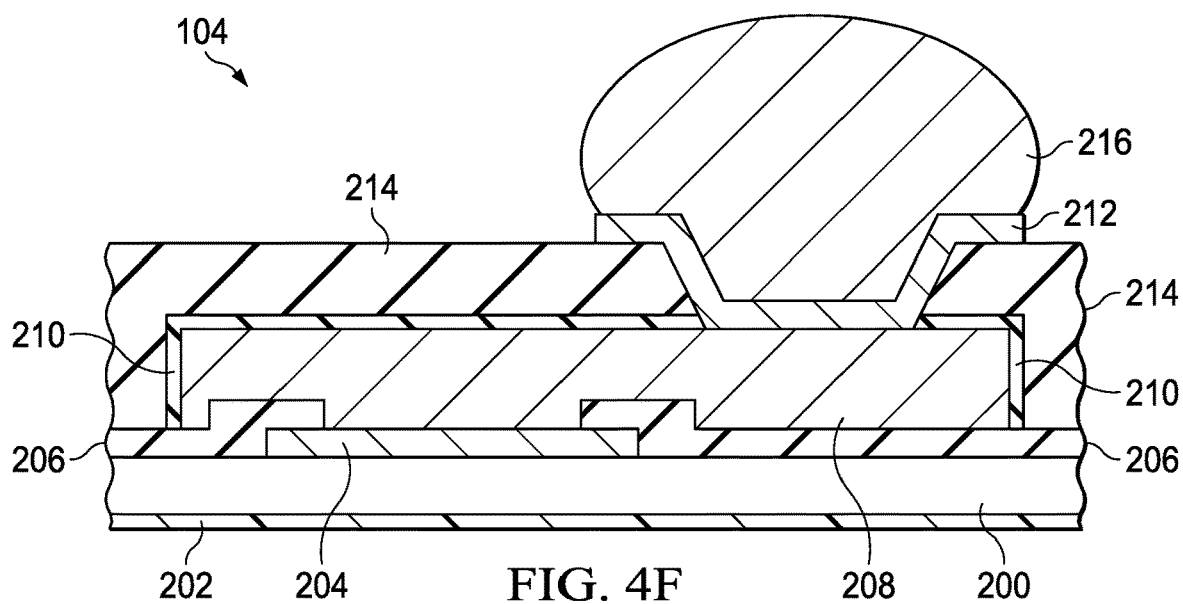

The method 300 includes applying a polyimide (PI) layer on the SiN layer and performing an etch of the polyimide layer (308). FIG. 4D shows the PI layer 214 abutting the SiN layer 210 and having been etched to produce a gap 406. The gap 406 exposes the underlying conductive layer 208, as shown. The method 300 includes forming a third conductive layer at the gap and dropping a solder ball on the third conductive layer (310). FIG. 4E shows the application of a resist layer 408 abutting the PI layer 214, and FIG. 4F shows the deposition (e.g., by plating) of the conductive layer 212 such that the conductive layer 212 establishes contact with the conductive layer 208 through the gap 402 in the SiN layer 210. The solder ball 216 is positioned on the conductive layer 212.

Figure 5:
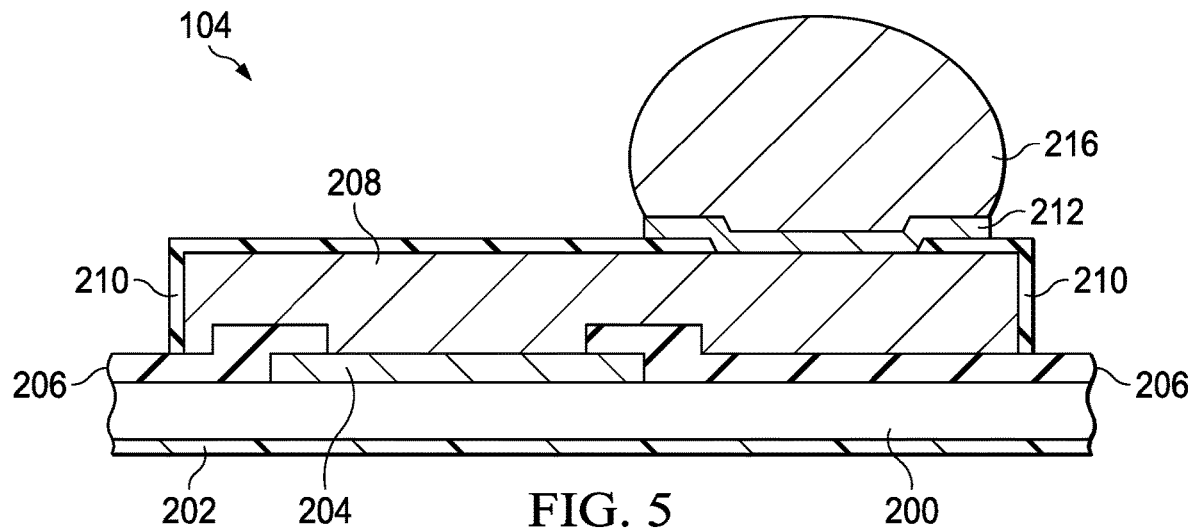
FIG. 5 is a profile cross-sectional view of a semiconductor package having a silicon nitride layer protecting a metal layer, in accordance with various examples.

FIG. 5 is a profile cross-sectional view of another example of the semiconductor package 104 of FIG. 1. The semiconductor package 104 of FIG. 5 is structurally identical to that of FIG. 2, except that the PI layer 214 of FIG. 2 is omitted, and, consequently, the conductive layer 212 is shallower than shown in FIG. 2. Omitting the PI layer 214 is not detrimental to the integrity of the conductive layer 208 because the SiN layer 210 protects the conductive layer 208 as described in detail above.

Figure 6:
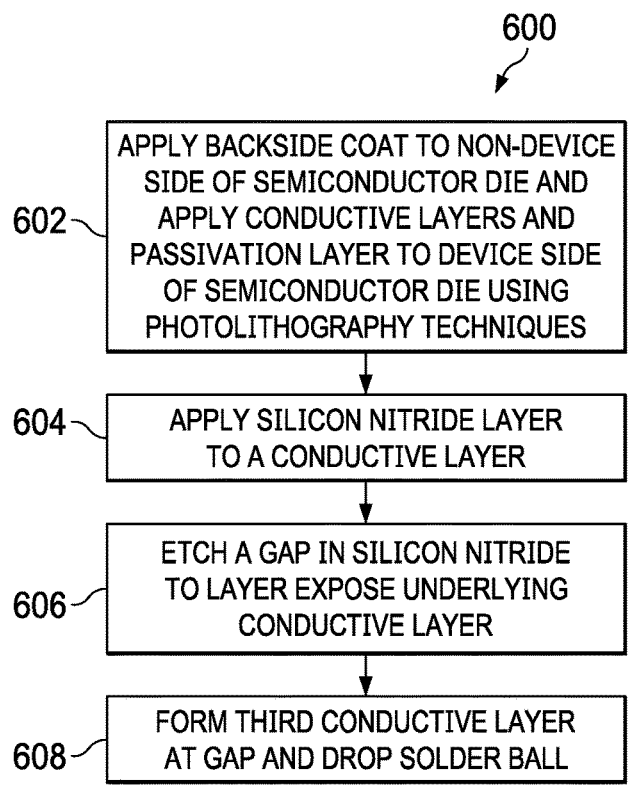
FIG. 6 is a flow diagram of a method for manufacturing a semiconductor package having a silicon nitride layer protecting a metal layer, in accordance with various examples.
Figure 7A:
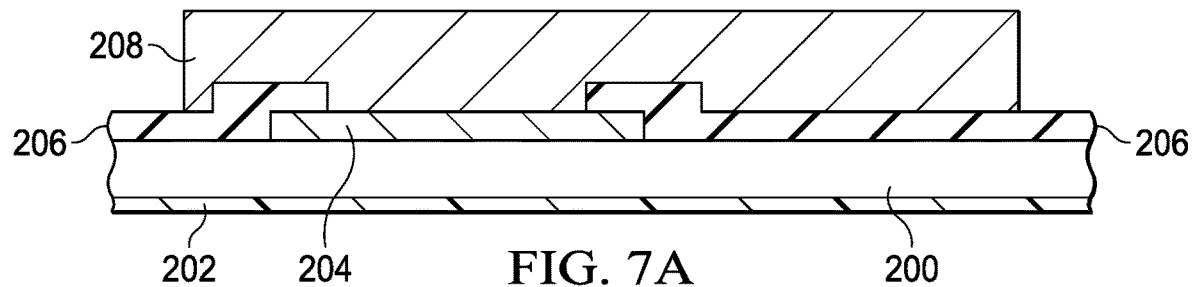
FIGS. 7A-7E are a process flow for manufacturing a semiconductor package having a silicon nitride layer protecting a metal layer, in accordance with various examples.
Figure 7B:
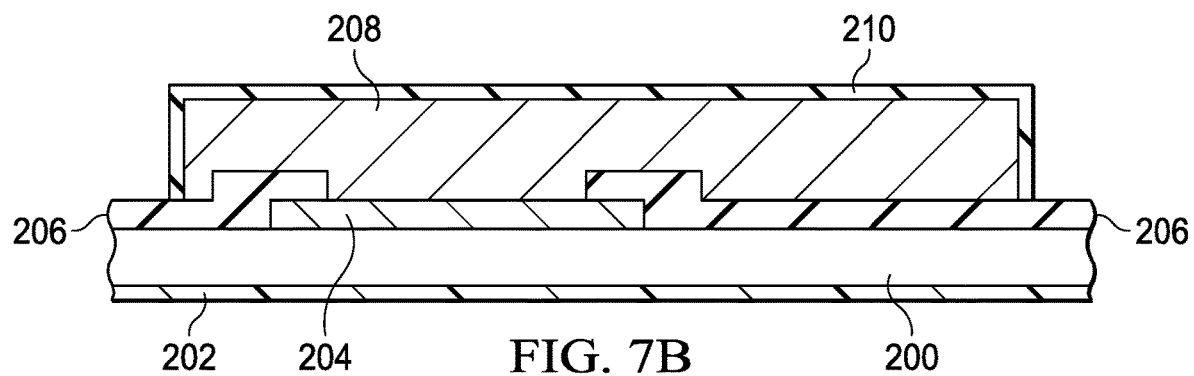
Figure 7C:
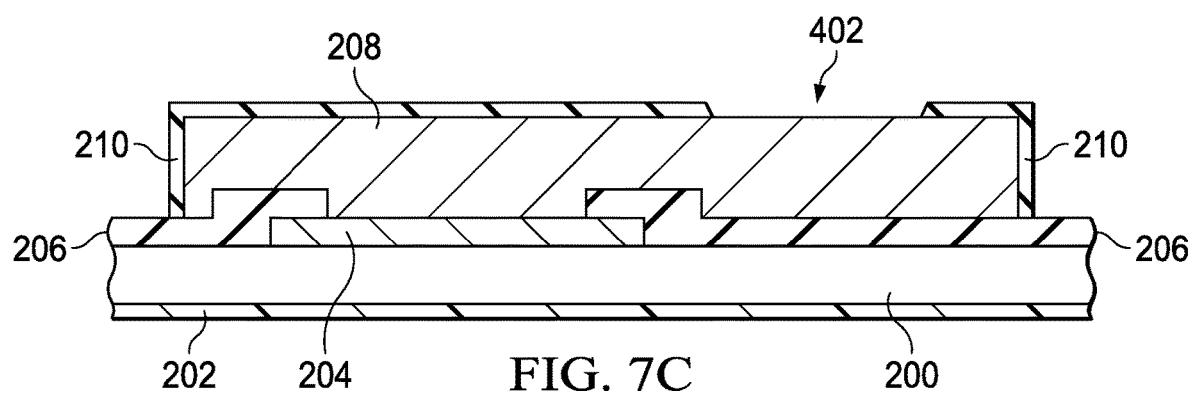

FIG. 6 is a flow diagram of a method 600 for manufacturing the semiconductor package 104 of FIG. 5, in accordance with various examples. FIGS. 7A-7E are a process flow for manufacturing the semiconductor package 104 of FIG. 5, in accordance with various examples. Accordingly, FIGS. 6 and 7A-7E are now described in parallel. The method 600 begins with applying a backside coat to a non-device side of a semiconductor die and applying conductive layers and a passivation layer to a device side of the semiconductor die using photolithography techniques (602). FIG. 7A is a profile cross-sectional view of the semiconductor die 200, the backside coat 202 abutting the non-device side of the semiconductor die 200, the conductive layer 204 abutting the device side of the semiconductor die 200, the PO layer 206 abutting the conductive layer 204 and the device side of the semiconductor die 200, and the conductive layer 208 abutting the conductive layer 204 and the PO layer 206. The method 600 includes applying a SiN layer to a conductive layer (604). FIG. 7B shows the SiN layer 210 having been deposited on the conductive layer 208. The SiN layer 210 has the qualities and is deposited using the specific techniques described above. The method 600 includes etching a gap in the SiN layer to expose the underlying conductive layer (606). FIG. 7C shows a gap 402 having been etched in the SiN layer 210 to expose the underlying conductive layer 208. The SiN layer 210 may be etched using a dry etch or a wet etch. For example, a hydrofluoric acid etchant may be used. In the example of FIG. 7C, the use of a photoresist etch mask is assumed, but other materials (e.g., polyimide) also may be used. The gap may be of any suitable width, but in examples, is at least as wide as necessary to facilitate the conduction of sufficient current for the intended application.

Figure 7D:
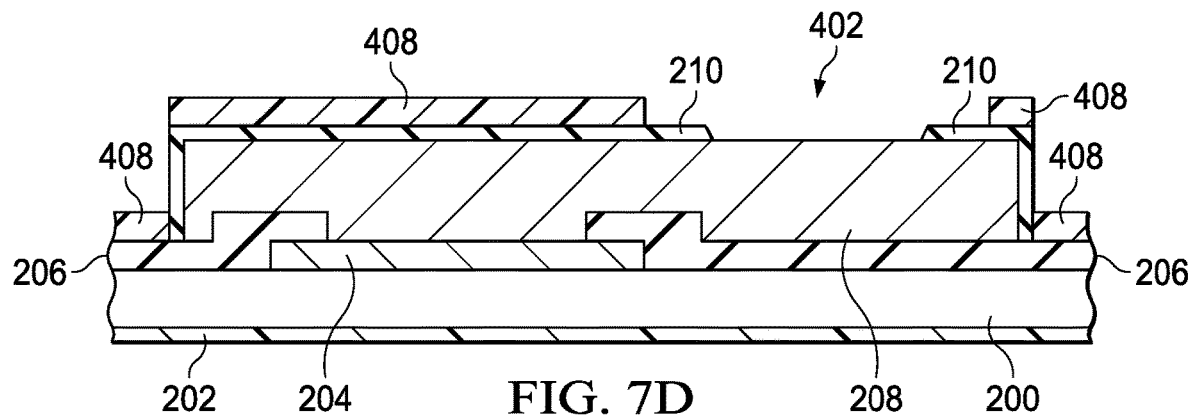
Figure 7E:
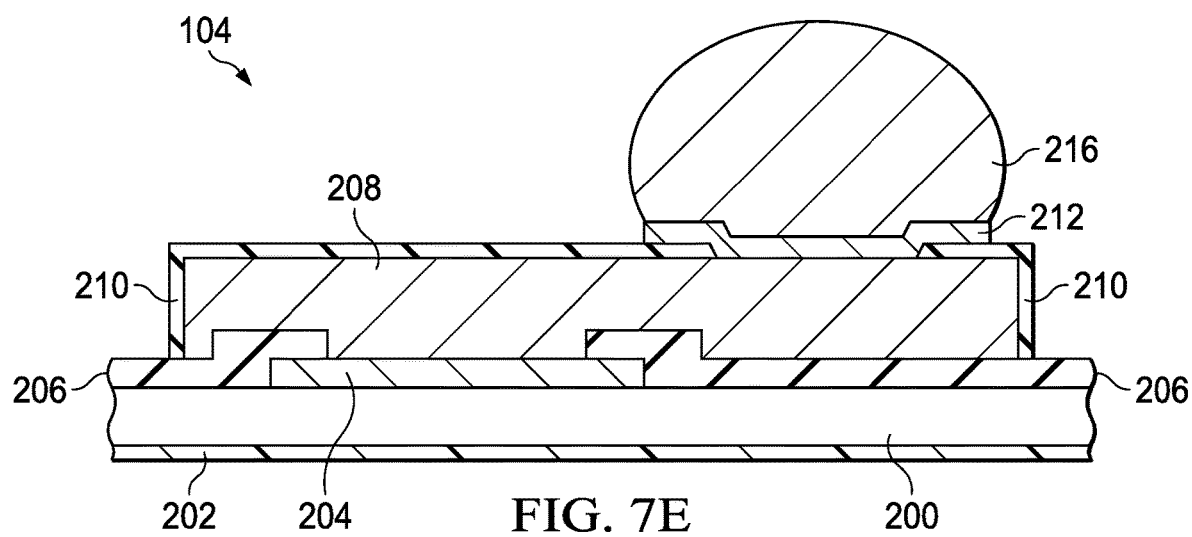

The method 600 includes forming a third conductive layer at the gap and dropping a solder ball on the third conductive layer (608). FIG. 7D shows the application of a resist layer 408 abutting the SiN layer 210 and the PO layer 206, and FIG. 7E shows the deposition (e.g., by plating) of the conductive layer 212 such that the conductive layer 212 establishes contact with the conductive layer 208 through the gap in the SiN layer 210. The solder ball 216 is positioned on the conductive layer 212.

The term "couple" is used throughout the specification. The term may cover connections, communications, or signal paths that enable a functional relationship consistent with this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

Unless otherwise stated, "about," "approximately," or "substantially" preceding a value means+/− 10 percent of the stated value. Modifications are possible in the described examples, and other examples are possible within the scope of the claims.

What is claimed is:

1. A semiconductor package, comprising:
   a semiconductor die;
   a passivation layer abutting a device side of the semiconductor die;
   a first conductive layer abutting the device side of the semiconductor die;
   a second conductive layer the passivation layer and physically contacting the first conductive layer;
   a silicon nitride layer abutting the second conductive layer; and
   a third conductive layer coupled to the second conductive layer at a gap in the silicon nitride layer, the third conductive layer configured to receive a solder ball.

2. The semiconductor package of claim 1, wherein the semiconductor package further comprises a polyimide layer abutting the silicon nitride layer and an underside of the third conductive layer.

3. The semiconductor package of claim 1, wherein the silicon nitride layer is deposited using a vapor deposition technique at a pressure lower than 100 Torr.

4. The semiconductor package of claim 1, wherein the silicon nitride layer is deposited at a temperature ranging from 325 degrees Celsius to 425 degrees Celsius.

5. The semiconductor package of claim 1, wherein the silicon nitride layer has a film stress ranging from −2 GPa to 2 GPa.

6. The semiconductor package of claim 1, wherein the silicon nitride layer having a thickness ranging from 300 Angstroms to 3000 Angstroms.

7. The semiconductor package of claim 1, wherein the third conductive layer is an under bump metallization (UBM) layer.

8. A semiconductor package, comprising:
   a semiconductor die;
   a passivation layer abutting a device side of the semiconductor die;
   a first conductive layer abutting the passivation layer;
   a silicon nitride layer physically contacting the first conductive layer, the silicon nitride layer having a thickness ranging from 300 Angstroms to 3000 Angstroms; and
   a second conductive layer coupled to the first conductive layer at a gap in the silicon nitride layer, the second conductive layer having an underside abutting the silicon nitride layer, the second conductive layer configured to receive a solder ball.

9. The semiconductor package of claim 8, wherein the silicon nitride layer is deposited at a temperature ranging from 325 degrees Celsius to 425 degrees Celsius.

10. The semiconductor package of claim 8, wherein the silicon nitride layer has a film stress ranging from −2 GPa to 2 GPa.

11. The semiconductor package of claim 8, wherein the silicon nitride layer deposited using a vapor deposition technique at a pressure lower than 100 Torr.

12. A semiconductor package, comprising:
   a semiconductor die including a first conductive layer on a device side;
   a passivation layer in contact with the first conductive layer and the device side;
   a second conductive layer in contact with the first conductive layer and the passivation layer;
   a silicon nitride layer in contact with the second conductive layer;
   an under bump metallization (UBM) layer in contact with the second conductive layer and the silicon nitride layer;
   solder in contact with the UBM layer.

13. The semiconductor package of claim 12 further comprising polyimide layer in contact with the silicon nitride layer, the passivation layer, and the UBM layer.

14. The semiconductor package of claim 12, wherein semiconductor package is a wafer-level chip scale package (WCSP).

15. The semiconductor package of claim 12, wherein the UBM layer is in contact with the second conductive layer via a gap in the silicon nitride layer.

* * * * *